United States Patent
Cathelin et al.

(10) Patent No.: US 7,852,174 B2
(45) Date of Patent: *Dec. 14, 2010

(54) NEGATIVE CAPACITY CIRCUIT FOR HIGH FREQUENCIES APPLICATIONS

(75) Inventors: Andreia Cathelin, Laval (FR); Stephane Razafimandimby, Grenoble (FR); Cyrille Tilhac, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 652 days.

This patent is subject to a terminal disclaimer.

(21) Appl. No.: 11/840,140

(22) Filed: Aug. 16, 2007

(65) Prior Publication Data

US 2008/0088390 A1   Apr. 17, 2008

(30) Foreign Application Priority Data

Aug. 17, 2006   (FR)   ................... 06 07343

(51) Int. Cl.
*H03H 11/46* (2006.01)
*H03H 9/54* (2006.01)

(52) U.S. Cl. .................. 333/213; 333/188
(58) Field of Classification Search .......... 333/188, 333/213, 214–217; 331/107 A, 117 R
See application file for complete search history.

(56) References Cited

U.S. PATENT DOCUMENTS

| | | | |
|---|---|---|---|
| 4,575,690 A | 3/1986 | Walls et al. | |
| 5,043,681 A | 8/1991 | Tanemura et al. | |
| 5,384,501 A * | 1/1995 | Koyama et al. | ............. 327/336 |
| 5,717,363 A | 2/1998 | Imai et al. | |
| 5,777,522 A | 7/1998 | Rybicki et al. | |

(Continued)

FOREIGN PATENT DOCUMENTS

DE   4306512   9/1994

(Continued)

OTHER PUBLICATIONS

Drew, J. et al., "Generation of Negative Capacitance in a Common Gate MESFET Stage and Application to Optical Receiver Design at Microwave Frequencies," Wideband Circuits, Modeling and Techniques, The Institution of Electrical Engineers, May 1996, pp. 2/1-2/5.

(Continued)

*Primary Examiner*—Robert Pascal
*Assistant Examiner*—Alan Wong
(74) *Attorney, Agent, or Firm*—Lisa K. Jorgenson; Robert Iannucci; Seed IP Law Group PLLC

(57) ABSTRACT

A negative capacitances circuit includes first and second branches connected between a first reference voltage and a second reference voltage. The first branch includes, in series, a first biasing resistor, a first diode, a first bipolar transistor, and a first current source. The second branch includes, in series, a second biasing resistor, a second diode, a second bipolar transistor, and a second current source. The first transistor has a base coupled to a collector of the second transistor and to one input, and the second transistor has a base coupled to a collector of the first transistor and to another input. A capacitor is connected between the emitter of said first transistor and the emitter of said second transistor. A linearization resistor is coupled in parallel between the two emitters of said first and said second transistors.

26 Claims, 17 Drawing Sheets

U.S. PATENT DOCUMENTS

| | | | |
|---|---|---|---|
| 6,239,664 B1 | 5/2001 | Northam | |
| 6,489,838 B1 * | 12/2002 | Tsinker | 327/557 |
| 6,696,899 B2 | 2/2004 | Ruffieux | |
| 6,798,304 B2 | 9/2004 | Gomez | |
| 7,065,331 B2 | 6/2006 | Korden et al. | 455/150.1 |
| 7,135,940 B2 | 11/2006 | Kawakubo et al. | |
| 7,274,274 B2 | 9/2007 | Carpentier | 333/188 |
| 7,345,554 B2 | 3/2008 | Cathelin et al. | |
| 7,423,502 B2 * | 9/2008 | Razafimandimby et al. | 333/188 |
| 2008/0088393 A1 * | 4/2008 | Cathelin et al. | 334/84 |

FOREIGN PATENT DOCUMENTS

| | | |
|---|---|---|
| EP | 1265352 | 12/2002 |
| FR | 2864729 | 7/2005 |
| FR | 2864733 | 7/2005 |
| JP | 10-256830 | 9/1998 |

OTHER PUBLICATIONS

Kolev, S. et al., "Using a Negative Capacitance to Increase the Tuning Range of a Varactor Diode in MMIC Technology," IEEE Transactions on Microwave Theory and Techniques, Dec. 2001, pp. 2425-2430.

Thanachayanont, A., et al., "Class AB VHF CMOS Active Inductor," The 2002 45th Midwest Symposium on Circuits and Systems, Conference Proceedings, Tulsa, OK, Aug. 4-7, 2002, IEEE, pp. 64-67.

* cited by examiner $$i = g_m(-V1-Va) \quad (1)$$

$$i = jC\omega(Va-(-Va)) = 2jC\omega Va \quad (2)$$

(2) dans (1) $\Rightarrow$ $i\left(1 + \dfrac{g_m}{j2C\omega}\right) = -g_m V1$ $$\dfrac{V1}{i} = -\dfrac{1}{g_m} - \dfrac{1}{j2C\omega}$$

$$Z = \dfrac{(V1-V2)}{i} = -\dfrac{2}{g_m} - \dfrac{1}{jC\omega}$$

*FIG. 3*

Comparison curves
(positive and negative capacitors)

Comparison charts
(inductors/negative capacitors)

Series frequency
$$\omega_s = \sqrt{\frac{1}{Lm \times Cm}}$$

Parallel frequency
$$\omega_p = \sqrt{\frac{1}{Lm \times Cm}} \times \sqrt{\frac{Cm + C0}{C0}}$$

NEGATIVE CAPACITY CIRCUIT FOR HIGH FREQUENCIES APPLICATIONS

TECHNICAL FIELD

The present disclosure generally relates to the field of electronic circuits and more particularly but not exclusively to a negative capacitance circuit.

BACKGROUND INFORMATION

Circuits achieving an electric model being equivalent to a negative capacitor are already known in the art, as shown in the following publications.

The document "*Using a negative capacitance to increase the tuning range of a varactor diode in MMIC technology*", Svilen Kolev, IEEE Transactions on microwave theory and techniques, December 2001, discloses a first application of such a negative capacitance circuit.

Another application of such a circuit is disclosed in this publication "*Generation of negative capacitance in a common gate MESFET stage and application to optical receiver design at microwave frequencies*", Jason D Drew, Wideband circuits, modeling and techniques, IEE colloquium, May 1996.

However, one may notice that such circuits can not be used for high frequencies applications, operating at frequencies beyond 2 Ghz in BiCMOS technology.

BRIEF SUMMARY

An embodiment provides a negative capacitance circuit for high frequencies applications.

An embodiment provides a negative capacitance circuit which is simple to carry out and which can be used for RF filters for mobile telecommunications.

Another embodiment provides a negative capacitance circuit which can be easily combined with filtering circuits based on Bulk Acoustic Wave (B.A.W.) resonators.

An embodiment of a negative capacitance circuit comprises a first input (In+) and a second input (In−).

The circuit of one embodiment further comprises:
a first branch connected between a first reference voltage (Vdd) and a second voltage reference (Ground), the first branch including, in series, a first biasing resistor, a first diode, a collector-emitter circuit of a first bipolar transistor (43) and a first current source; and
a second branch connected between said first reference voltage (Vdd) and said second reference voltage (Ground), the second branch including, connected in series, a second biasing resistor, a second diode, a collector-emitter circuit of a second bipolar transistor and a second current source.

The base of the first transistor is coupled to the collector terminal of the second transistor and to said second input (In−). Furthermore, the base of the second transistor is coupled to the collector terminal of the first transistor and to the first input (In+).

The circuit of one embodiment further comprises a capacitor connected between the emitter terminal of the first bipolar transistor and the emitter terminal of the second bipolar transistor, and in addition a linearization resistor being coupled in parallel between the two emitter terminals of the first and the second bipolar transistors.

In one embodiment, the first and said second current sources are based on MOS type transistors.

In one particular embodiment the first and said second diodes are emitter-collector junctions of bipolar transistors.

In one particular embodiment, the negative capacitance circuit is coupled in parallel to a BAW type resonator so as to modify the anti-resonant frequency of that resonator.

Particularly in one embodiment, the circuit comprises a varactor which allows the adjustment of the series resonant frequency of the resonator.

In one embodiment, the capacitance circuit is used for carrying out a Voltage Control Oscillator (V.C.O.).

An embodiment of the invention is well fitted for the realization of RF filters for mobile telecommunications.

BRIEF DESCRIPTION OF THE SEVERAL VIEWS OF THE DRAWINGS

Other features of one or more non-limiting and non-exhaustive embodiments of the invention will best be understood by reference to the following detailed description when read in conjunction with the accompanying drawings.

FIG. 3 illustrates the example equations modeling the circuit of FIG. 1.

FIGS. 8A, 8B and 8C respectively illustrate the example electrical model and the characteristics charts of a BAW type resonator which can be combined to an embodiment of a negative capacitance circuit according to the present invention.

DETAILED DESCRIPTION

In the following description, numerous specific details are given to provide a thorough understanding of embodiments. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

There is now described one particular embodiment of a circuit comprising an integrated resonator in accordance with the present invention and which is adapted to the realization of a RF receiver which can be used for mobile telecommunications. More specifically, the circuit of one embodiment is associated with an acoustic resonator, such as, for instance, a Bulk Acoustic Wave (B.A.W.) or Surface Acoustic Wave (S.A.W.) resonator for the purpose of realizing highly effective filtering circuits.

Figure 1:
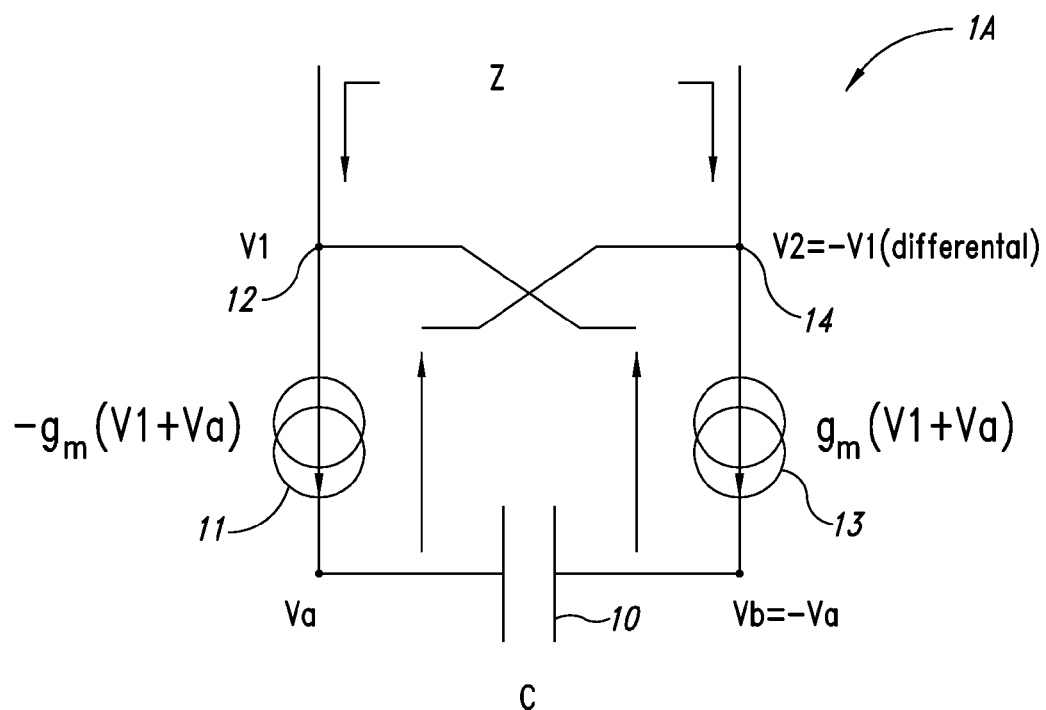
FIG. 1 illustrates the electric equivalent model of an embodiment of a negative capacitance circuit in accordance with the present invention.

With respect to FIG. 1, there is now described the realization of a negative capacitance circuit 1A between two terminals, respectively 12 and 14, which comprises, in series, a first controllable current source 11, a capacitor 10 and a second controllable current source 13.

The voltage of terminals 12 and 14 are respectively designated as V1 and V2 (V2 being supposed to be equal to $-V1$ in a differential configuration). In addition, one designates Va the voltage of the terminal at the junction between the first source 11 and capacitor 10, and one designates Vb the voltage of the terminal at the junction of the second source 13 and capacitor 10.

The equations ruling the operation of the two controllable current sources 11 and 13 are as follows:

$I=gm(V2+Vb)=-gm(V1+Va)$ for the controlled current source 11, and $I=gm(V1+Va)$ for controlled current source 13.

The parameter gm is, by definition, the transconductance of the voltage controlled source of bipolar transistors 43 and 48 (in FIG. 4) of the controllable current source.

Figure 2:
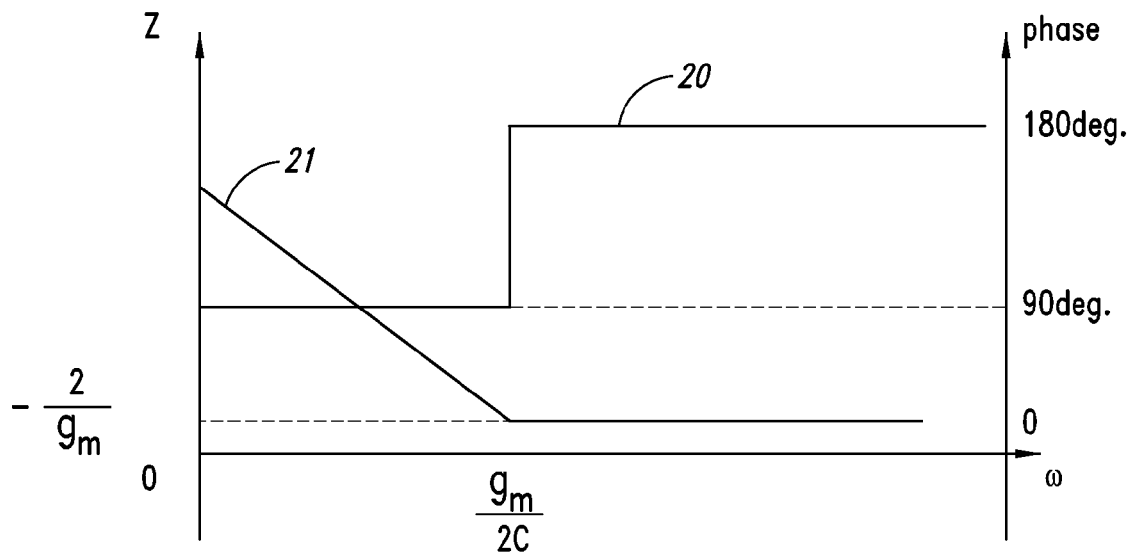
FIG. 2 illustrates the example characteristics charts of the impedance of the negative capacitance circuit of FIG. 1.

When considering this electrical equivalent model, the equations of which being illustrated in FIG. 3 for the sake of clarity, one notices that it is possible to achieve impedance curves complying with the charts shown in FIG. 2. It can be seen that, the impedance curve 21 falls with a slope of $-20$ dB/decade until it reaches a critical pulsation value being equal to gm/2C and, beyond that value, the circuit introduces a phase advance of 90 degrees on the phase curve 20.

Those curves clearly show the behavior of a resistive circuit having a negative capacitance.

Figure 4:
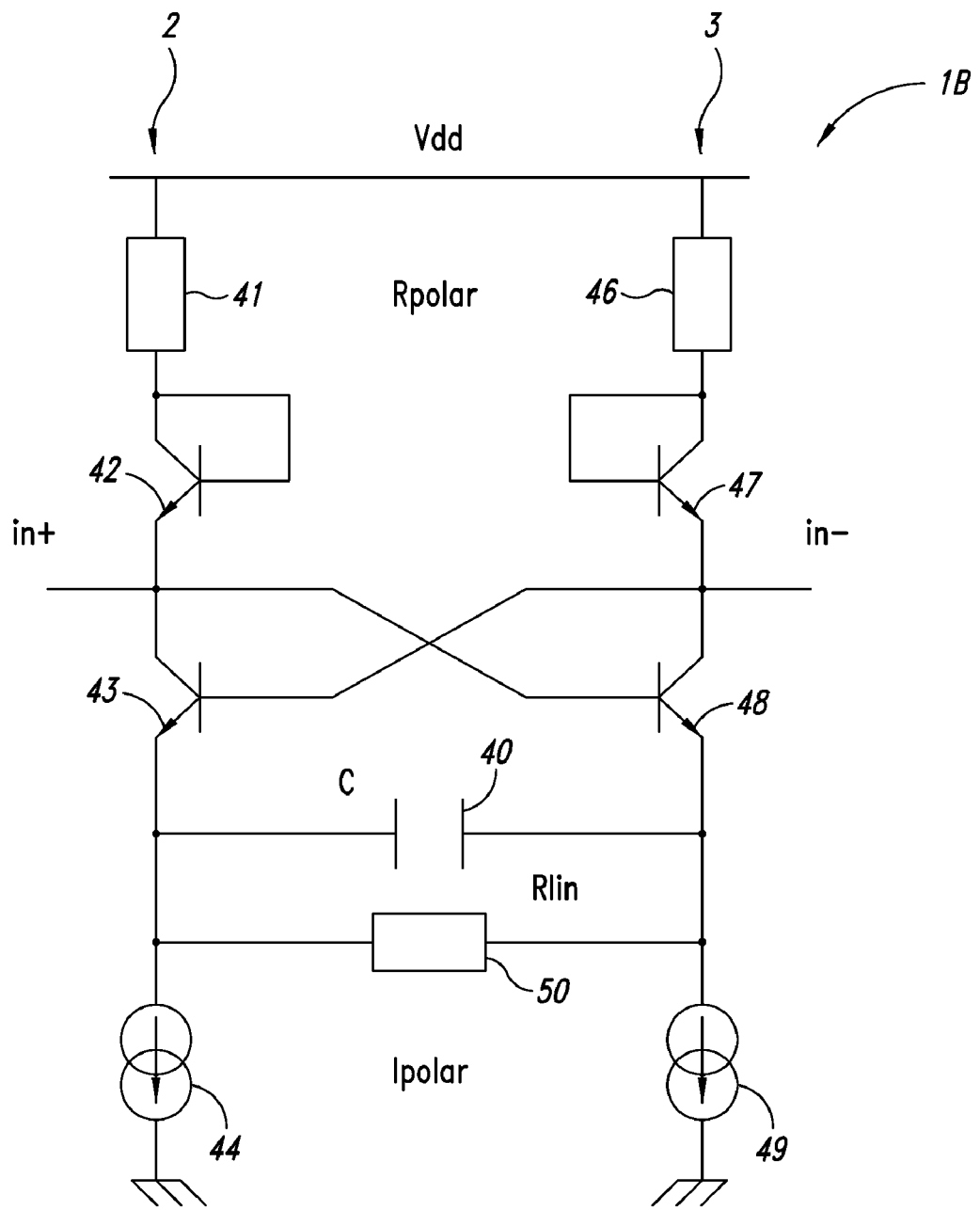
FIG. 4 illustrates an embodiment of a negative capacitance circuit according to the present invention.

FIG. 4 illustrates one embodiment of a circuit 1B in accordance with the present invention which is particular suitable for high frequencies.

This circuit 1B comprises a first and a second branch 2, 3, each being connected between a first reference voltage Vdd and a second reference voltage (Ground).

The first branch 2 comprises, connected in series, a first bias resistor 41, a first diode 42, and then a collector-emitter circuit (the collector-base and base-emitter junctions connected in series) of a first bipolar transistor 43 and a first current source 44.

The second branch 3 comprises, connected in series, a second bias resistor 46, a second diode 47, and then the collector—emitter circuit (i.e., the series of the collector-base and base-emitter junctions) of a second bipolar transistor 48 and then a second current source 49.

The base terminal of first transistor 43 is connected to the collector terminal of the second transistor 48 (corresponding to the input In−). Based on a differential configuration, the base terminal of the second transistor 48 is connected to the collector of the first transistor 43 (corresponding in addition to input In+).

At last, the circuit 1B includes a capacitor 40 having a value C which is connected between the emitter of the first bipolar transistor 43 and the emitter of the second bipolar transistor 48. A linearization resistor Rlin 50 is also connected in parallel between the two emitter terminals of the first and second bipolar transistors.

On may take advantage of bipolar transistors for circuits 43 and 44 since such bipolar transistors provide a high value of transconductance.

Current sources 44 and 49 are bias current sources which respectively cooperate with bias resistors 41 and 46.

In one particular embodiment, diodes 42 and 47 are carried out by using the emitter-collector junction of the bipolar transistors.

In one particular embodiment, these current sources 44 and 49 are carried out by using MOS type transistors. Alternatively, one can use bipolar type transistors.

It should be noticed that the circuit 1B of FIG. 4 enters into oscillation if no voltage control is applied to the terminals of the collector of the first and second bipolar transistors 43 and 48, respectively corresponding to inputs In− and In+.

On the other hand, when one applies a control voltage on the two inputs terminal In+ and In− which are respectively coupled to the collectors of transistors 43 and 48, one can prevent the oscillation by default of the circuit. In that situation, it has been seen that one emulates the circuit 1A which is illustrated in FIG. 1, and particularly adapted for high frequencies applications, such as beyond 2 Ghz. The linearization resistor 50 achieves the operation of the circuit for significant variations of the input voltages (of the order of 150 millivolts).

Figure 5:
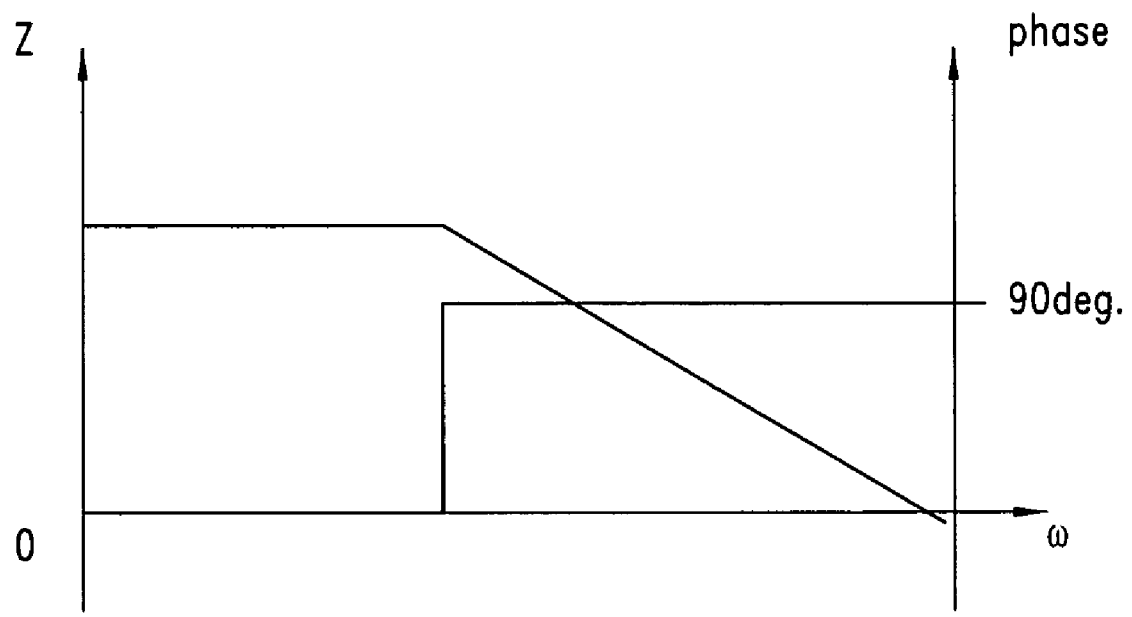
FIG. 5 illustrates the example characteristics charts of the circuit of FIG. 4.

FIG. 5 illustrates the charts which are representative of the impedance (modulus and phase) of the circuit 1B illustrated in FIG. 4. It can be seen that the curve of FIG. 2 has been slightly changed with the use of the linearization resistor 50 being connected in parallel with the capacitor 40 and the diode connected transistors.

Figure 6:
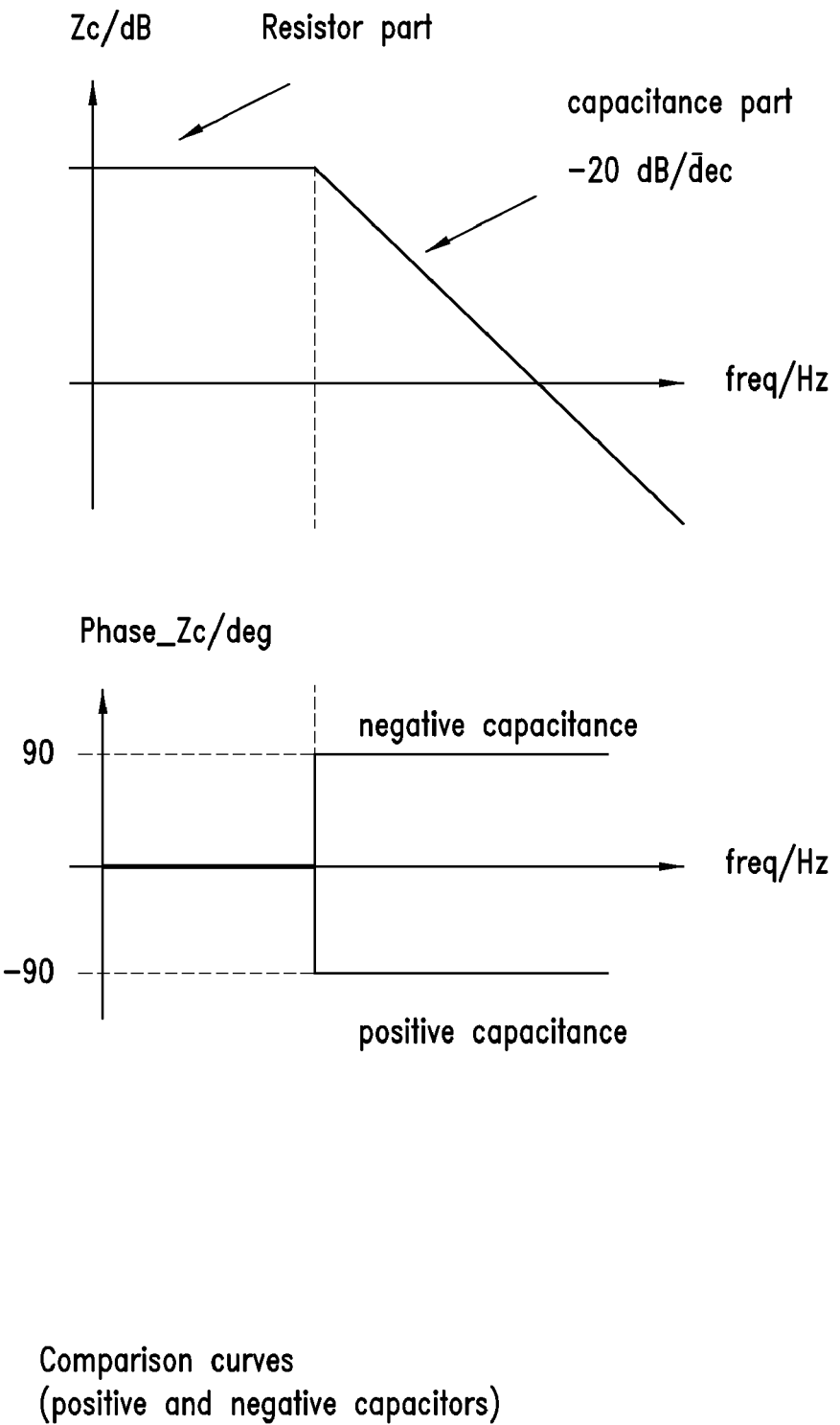
FIG. 6 illustrates, for comparison purpose, the example impedance charts of the circuit of FIG. 4 with respect to a standard positive capacitance.
Figure 7:
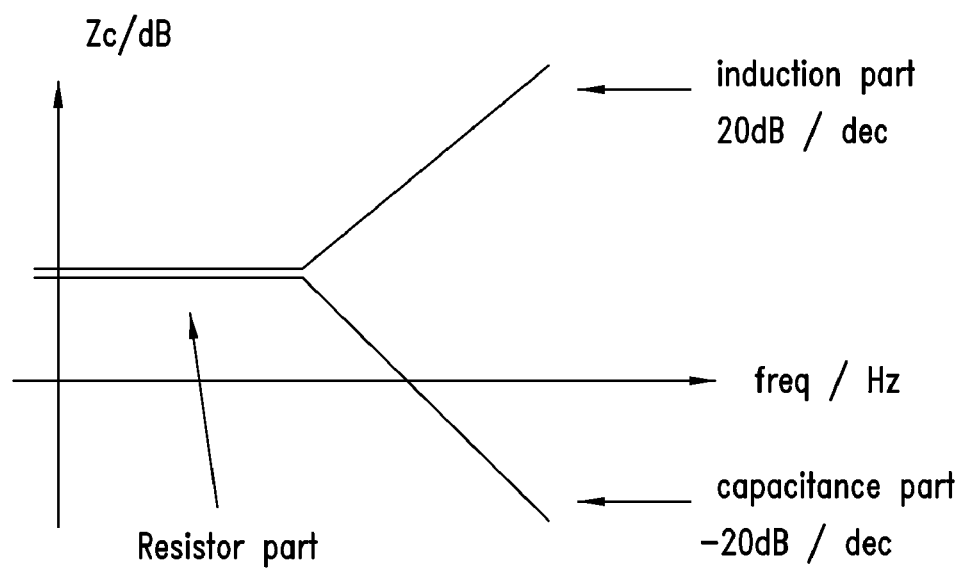
FIG. 7 illustrates, for comparison purpose, the example impedance and gain charts of the circuit of FIG. 4 with respect to an inductor.
Figure 7:
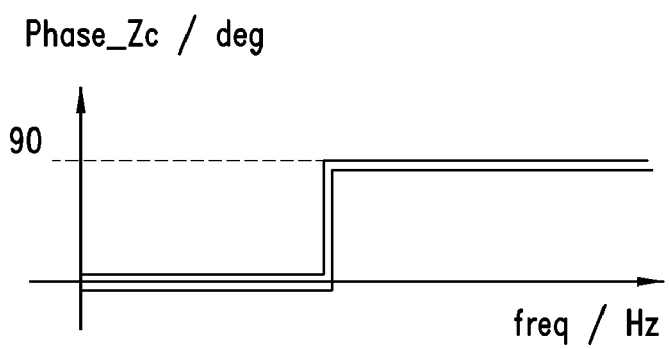

FIGS. 6 and 7 illustrate the operating of the circuit 1B of FIG. 4, with respect to the classical positive capacitance (FIG. 6) and the classical inductor (FIG. 7).

As it can be seen in FIG. 6, the impedance curve shows a decrease with a slope of $-20$ dB per decade beyond the cutting frequency. Regarding now the gain characteristics, one sees on the other hand a phase advance of 90 degrees from the cutting frequency, what can be opposed to the phase delay of 90 degrees which is known for a purely (positive) capacitance circuit.

This gives evidence that a negative capacitor circuit has been actually achieved.

FIG. 7 illustrates the characteristics charts for a standard inductor which is this is well known in the art, shows a phase advance from the cutting frequency. On the other hand, for the inductor, the impedance curve shows a decrease from the same cutting frequency, in contrary to the negative capacitance curve.

The circuit according to one embodiment of the present invention is likely to be usable in many applications, and is particularly suitable for high frequencies applications.

There is now described how to integrate, and this is a non-limiting example, an embodiment of the invention with a BAW type resonator in order to build a filtering circuit which is tunable. More specifically, one couples the negative capacitor circuit on the two terminals of a BAW resonator so as to modify the anti-resonance frequency of the same.

It will be more particularly described one embodiment including an integrated receiver which is well suited for the realization of a RF receiver usable for mobile telecommunication. Indeed, in mobile telecommunications and particularly in the more recent applications as Wide Code Division Multiplexing Access (WCDMA), one shows the need to perform a very effective filtering process. A new integrated acoustic component will be disclosed which should only be taken as an example for the embodiment of the invention.

Figure 8A:
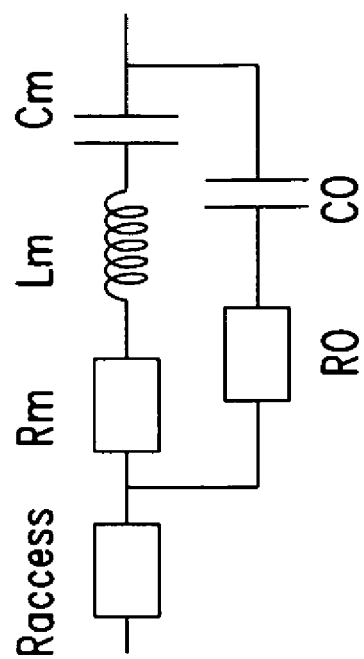
Figure 8A:
Figure 8A:
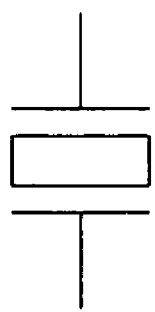
Figure 8B:
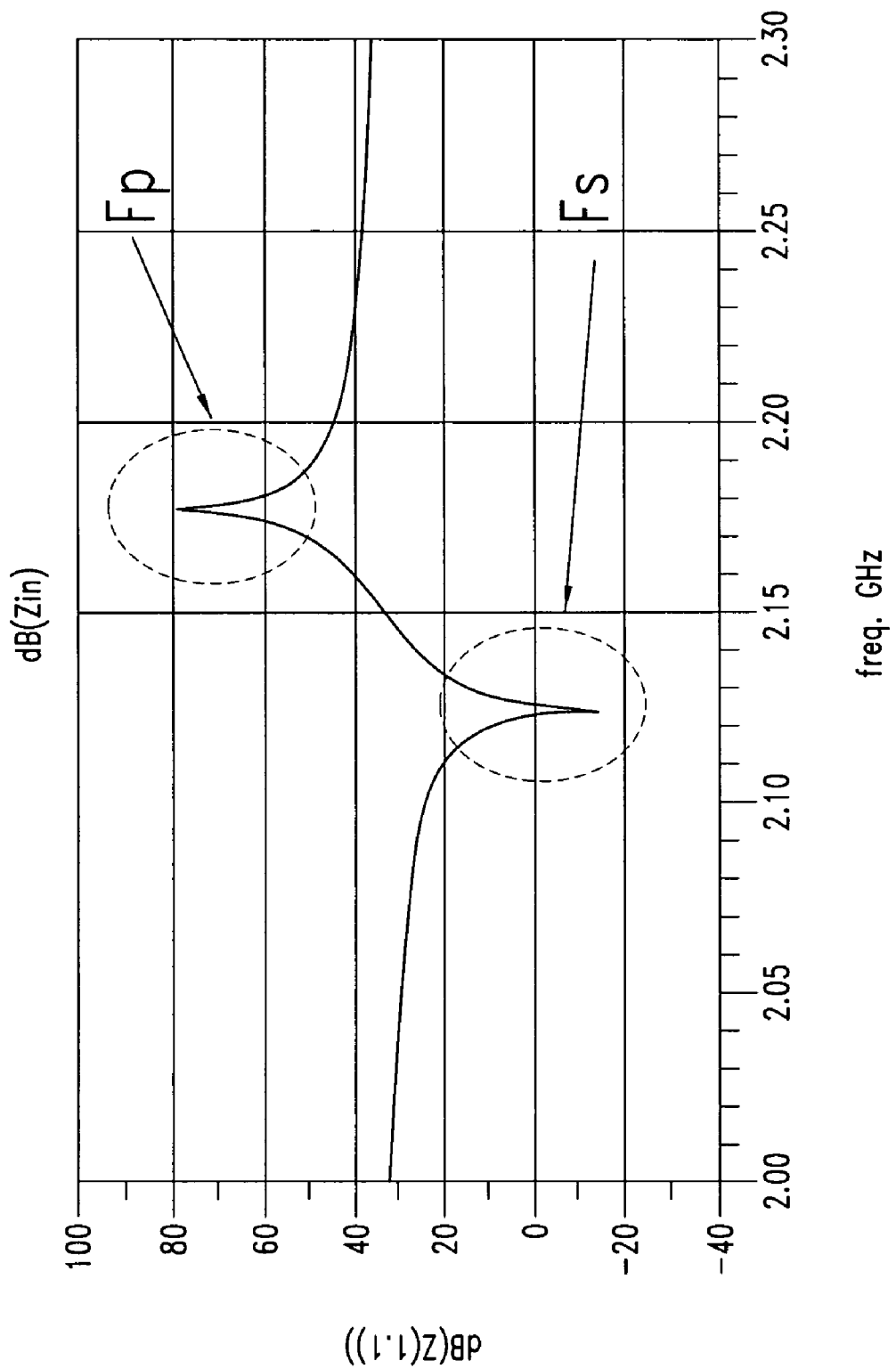

An embodiment of the invention provides a very effective and integrated filtering circuit by means of the combination of the negative capacitor circuit with a BAW resonator, the electrical equivalent model of which being illustrated in FIGS. 8A, 8B and 8C showing the phase and impedance charts as well as the series and parallel resonance frequencies equations.

Figure 9A:
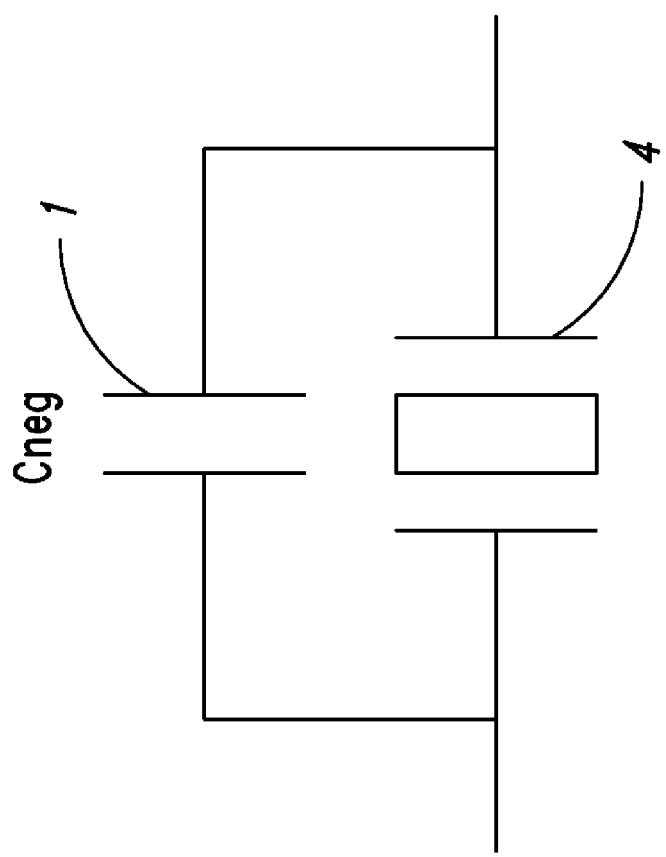
FIG. 9A illustrates the combination of a BAW resonator which is connected in parallel with a negative capacitance circuit according to one embodiment of the present invention.

FIG. 9A illustrates a first example application of a negative capacitor circuit 1 according to an embodiment of the present invention, wherein such circuit is coupled in parallel with a BAW type resonator 4. For example in one embodiment, the In+ and In− terminals of the negative capacitor circuit 1 can be respectively coupled to the two terminals of the resonator, thereby providing a parallel configuration.

Such combination has an effect, in a very surprising and advantageous manner, on the anti-resonance frequency Fp which is moved away from the series frequency so as to take full advantage of that resonance frequency. In this manner, one even achieves to get rid of any additional inductor which is known to occupy a non-negligible surface on the semiconductor chip and which, furthermore, results in the appearance of parasitic anti-resonance frequencies in low frequencies and a decrease of the quality factor of the acoustic filter constituted by the BAW resonator.

Figure 9B:
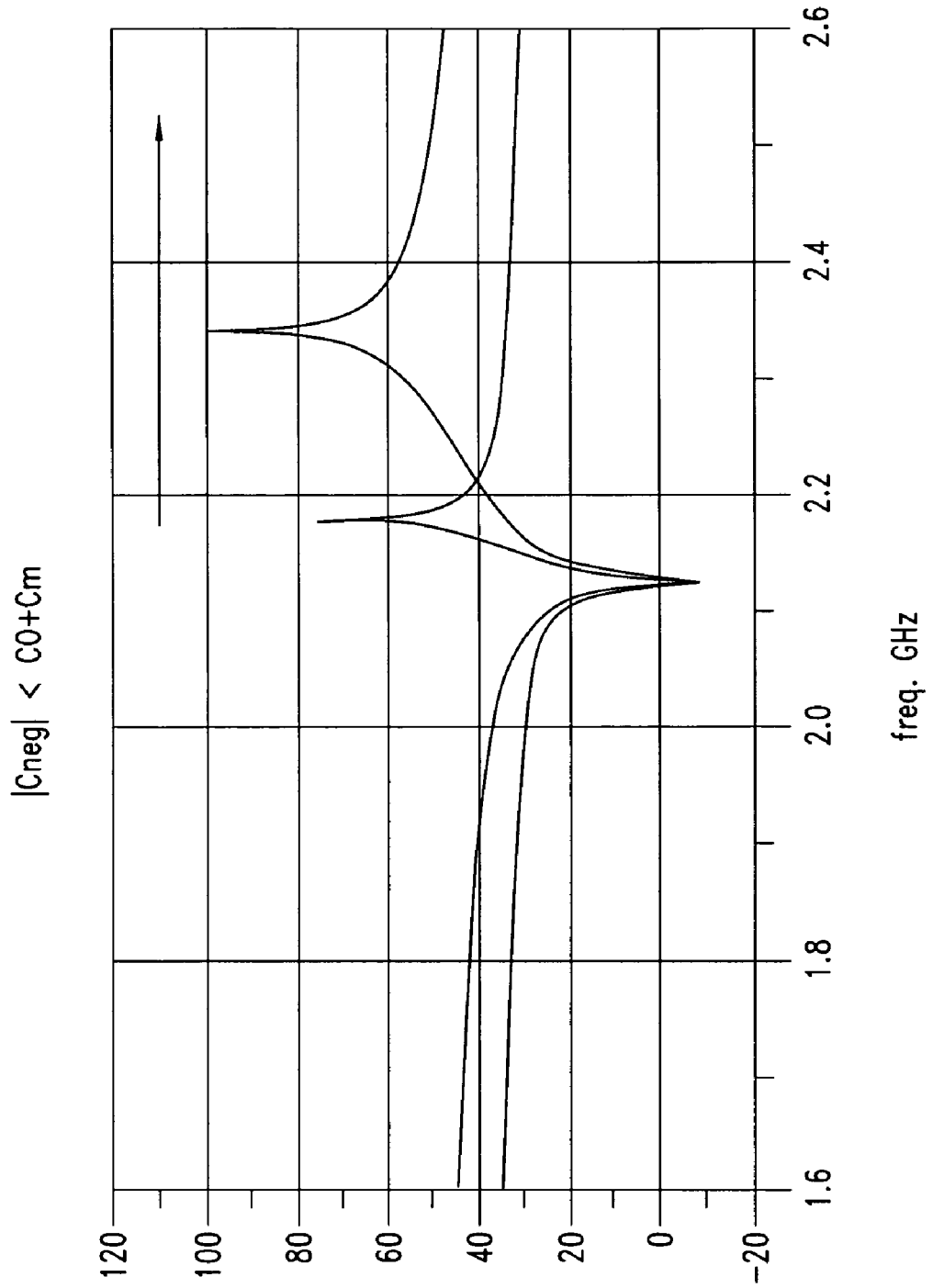
FIGS. 9B and 9C illustrate respectively the example effect of the negative capacitor on the anti-resonance frequency of the BAW resonator of FIG. 9A as a function of the difference between the absolute value of Cneg and C0+Cm.
Figure 9C:
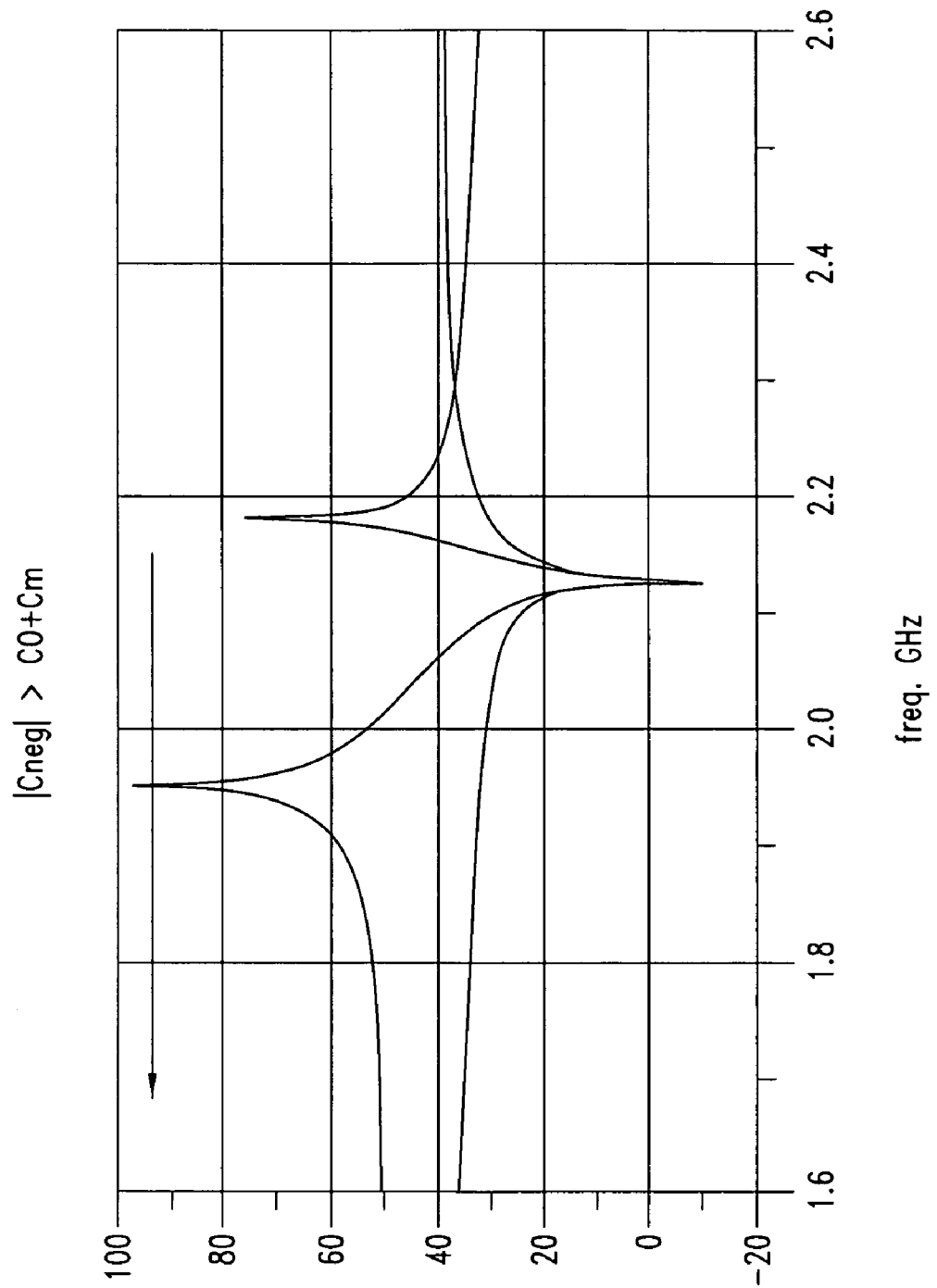

FIGS. 9B and 9C show that, as a function of the absolute value of this negative capacitor, it becomes possible to move, either towards the right direction or towards the left direction, the anti-resonance frequency Fp while keeping unchanged the series frequency.

More particularly, FIG. 9B shows that when the absolute value of Cneg is lower than the internal parameters C0+Cm of the BAW resonator, the anti-resonance frequency is being moved towards the right direction.

Conversely, the same anti-resonance frequency is moved towards the left, as illustrated in FIG. 9C when the absolute value of Cneg is higher than C0+Cm.

Figure 10A:
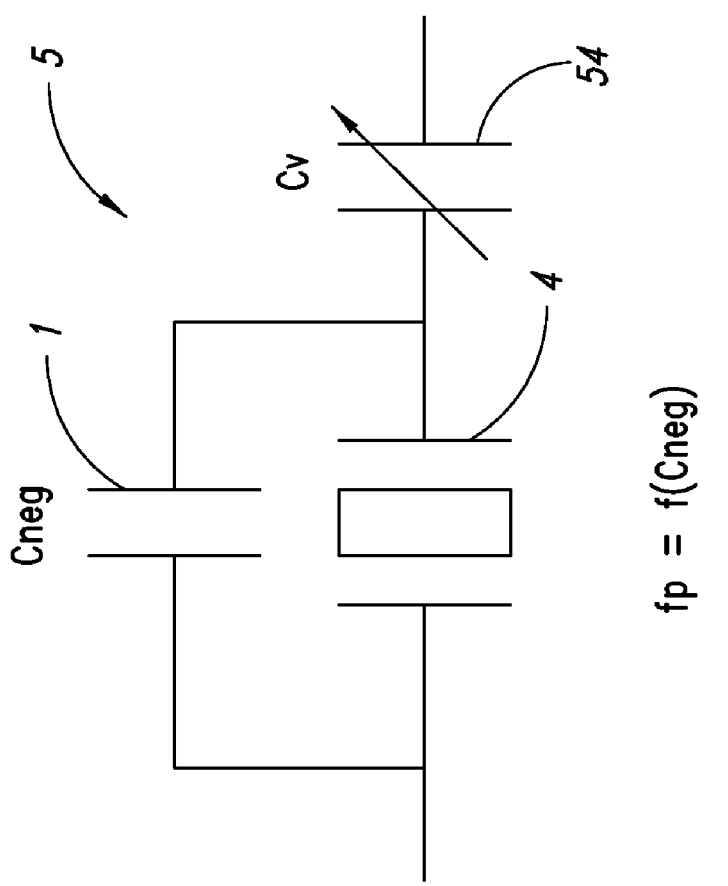
FIG. 10A illustrates another application of one embodiment of a negative capacitance circuit which is combined with a BAW oscillator and a varactor in order to carry out a tunable filter.

FIG. 10A illustrates a second example embodiment of a tunable resonator which uses the negative capacitor circuit according to an embodiment of the present invention. This second embodiment comprises, in series with the circuit of FIG. 9A, a tunable capacitive component 54, such as a varactor for instance, having an adjustable capacitance Cv.

There is thus provided a circuit 5 having multiple different tunable possibilities in accordance with the absolute value of Cneg.

Figure 10B:
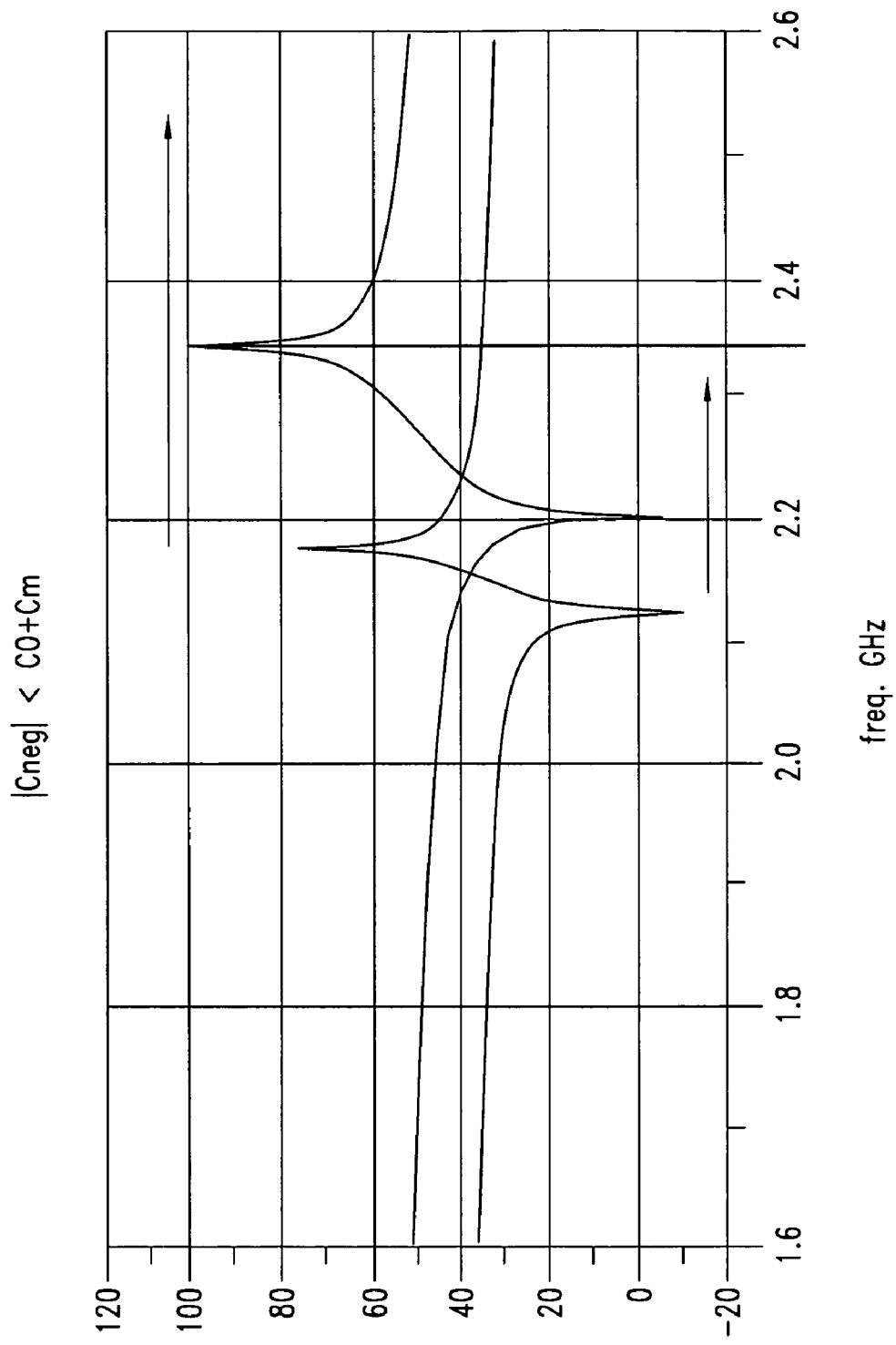
FIGS. 10B to 10D respectively illustrate the example characteristics charts of the circuit of FIG. 10A as a function of the value of the negative capacitance Cneg with respect to the values of C0+Cm, and C0+Cm+Cv.
Figure 10C:
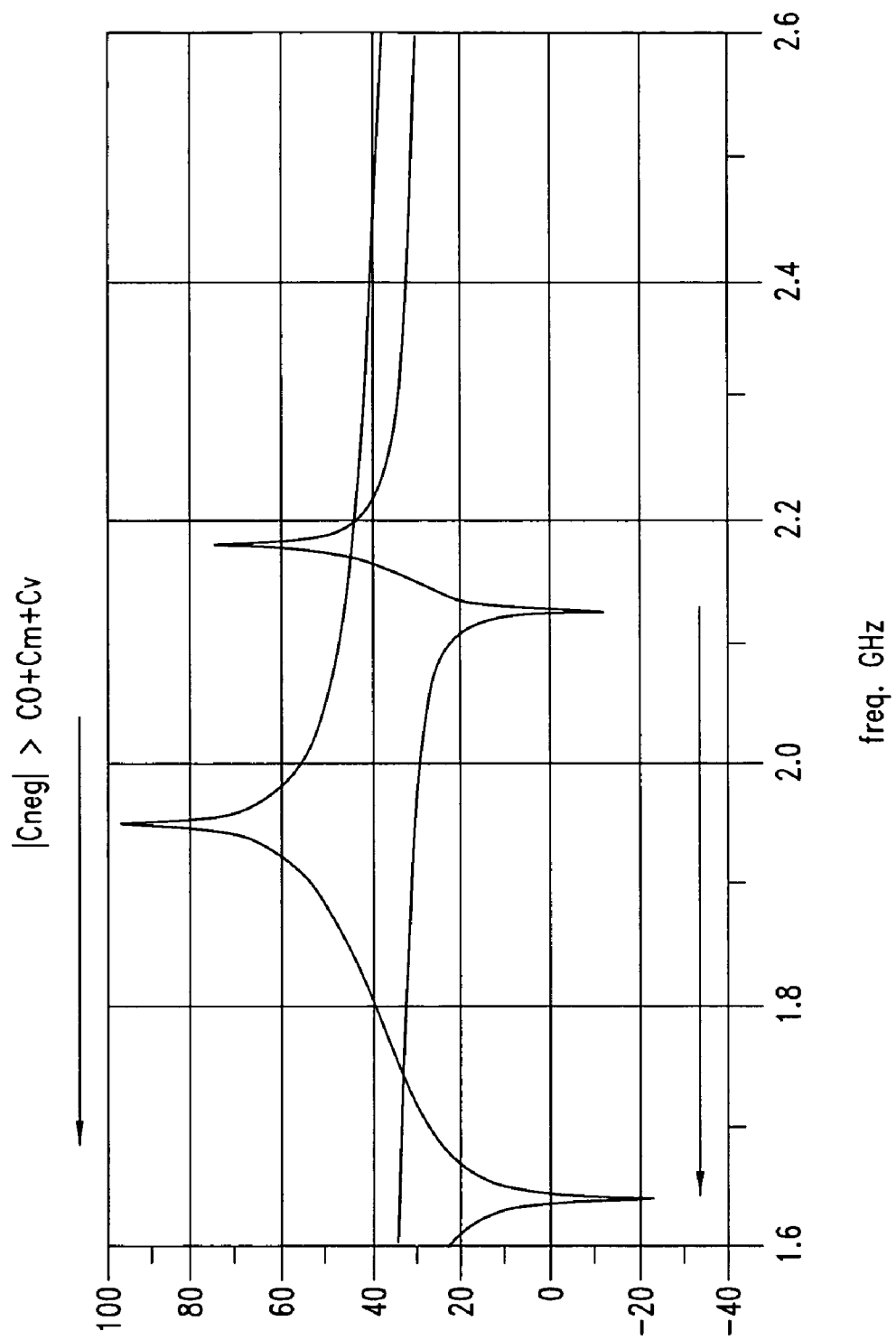
Figure 10D:
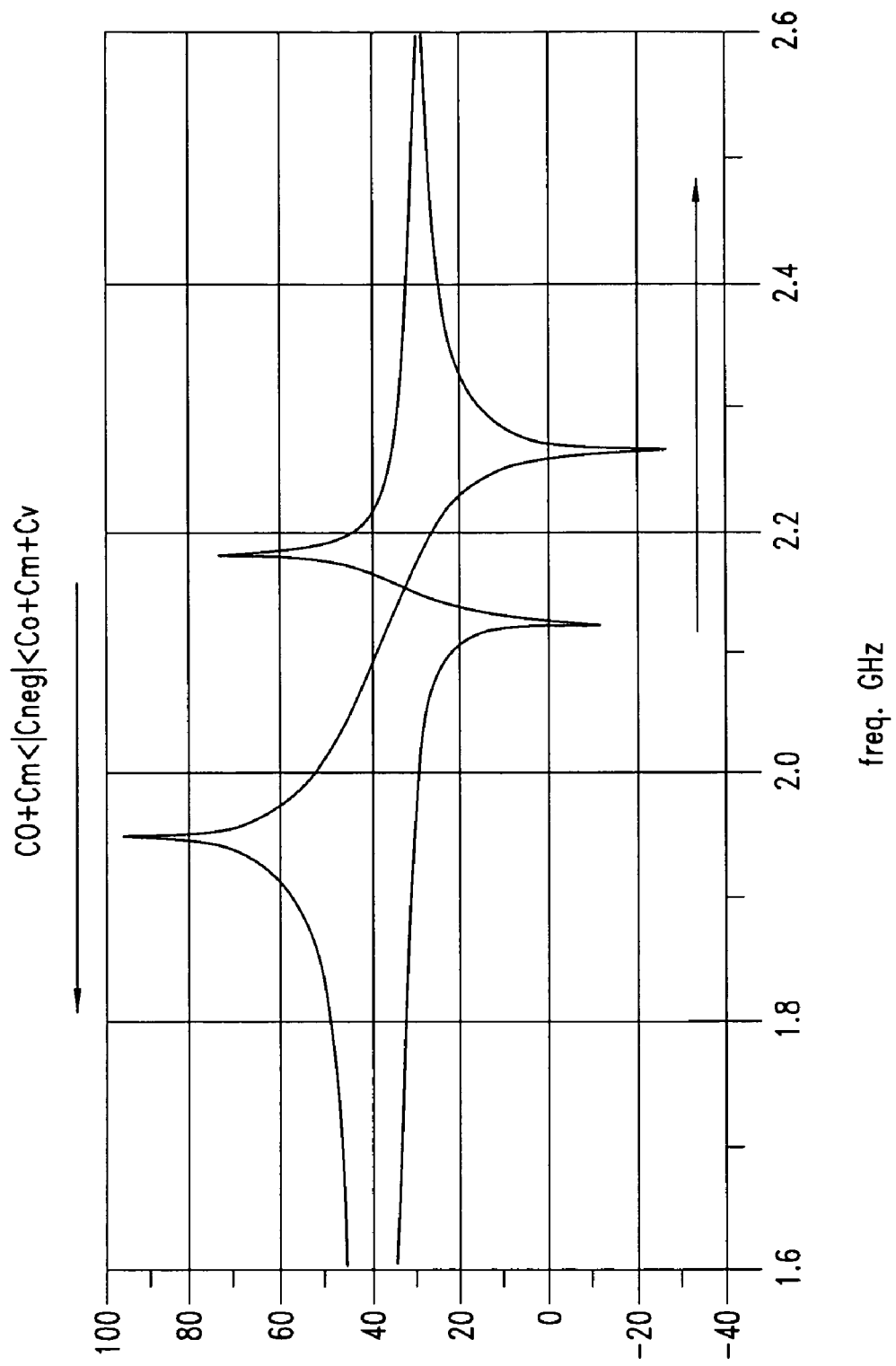

FIG. 10B to 10D respectively illustrate the characteristics charts of the second embodiment according to the value of the negative capacitance Cneg with respect to the values C0+Cm and C0+Cm+Cv.

When the absolute value of Cneg is lower than C0+Cm, one observes a shift to the right of the two series and parallel frequencies, as illustrated in FIG. 10B.

When the absolute value of Cneg is higher than C0+Cm+Cv, one then sees a shift to the left of both series resonance frequency Fs and parallel resonance frequency Fp, as illustrated in FIG. 10C.

At last, when the absolute value of Cneg is comprised within C0+Cm and C0+Cm+Cv, one notices that the series frequency is moved towards the right whereas the parallel frequency is shifted to the left, as illustrated in FIG. 10D.

It can thus be seen that, in accordance with the particular values given to the parameters Cneg and Cv, one may achieve a wide tuning of the resonance circuit.

Figure 11:
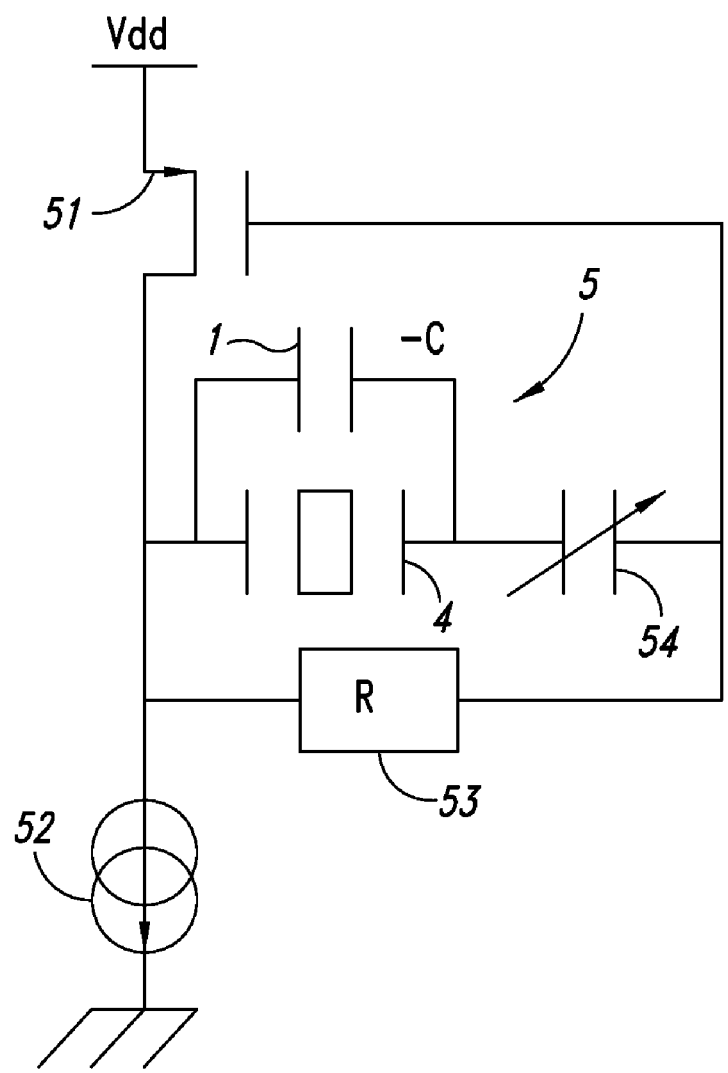
FIG. 11 illustrates another example application of a negative capacitance circuit according to an embodiment.

In another embodiment illustrated in FIG. 11, by combining the cell 5 shown in FIG. 10A with a loss compensation circuit based on a PMOS transistor 51 connected in series with a current source 52 as well as a resistor 53, one may achieve a tunable Voltage Controlled Oscillator (V.C.O.) which can be adjusted by means of the control of the variable capacitance (Cv).

In one embodiment, the variable capacitance Cv—represented by element 54 in the Figure—may be based on a matrix of interconnected capacitors in order to achieve a wide range of tuning. The capacitor 54 can be then controlled by means of a binary word so as to cover the frequency band comprised between the nominal resonance frequency, e.g., for the maximal value of the variable frequency, and the parallel frequency determined by the resulting value of the difference between C0 and Cneg.

As it can be seen in FIG. 11, the voltage controlled oscillator is based on a Pierce configuration biased by:
the bias current source 52;
the resistor 53 connecting the drain terminal of PMOS transistor 54 to the gate.

The size of the transistor is used for determining the level of the compensation of the loss required for maintaining the oscillation.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification, Abstract, and the claims, but should be construed to include all possible embodiments along with the full scope of equivalents to which such claims are entitled. Accordingly, the claims are not limited by the disclosure.

What is claimed is:

1. A negative capacitance circuit having a first input terminal and a second input terminal, the negative capacitance circuit comprising:
a first branch coupled between a first reference voltage terminal and a second reference voltage terminal, said first branch having, in series, a first biasing resistor, a first diode, a collector-emitter circuit of a first bipolar transistor and a first current source;
a second branch coupled between said first reference voltage and said second reference voltage, said second branch having, in series, a second biasing resistor, a second diode, a collector-emitter circuit of a second bipolar transistor and a second current source, said first transistor having a base terminal which is coupled to a collector terminal of said second transistor and to said second input terminal, and said second transistor having a base terminal which is coupled to a collector terminal of said first transistor and to said first input terminal;
a capacitor connected between the emitter terminal of said first bipolar transistor and the emitter terminal of said second bipolar transistor;
a linearization resistor which is coupled in parallel between the two emitter terminals of said first and said second bipolar transistors.

2. The negative capacitance circuit according to claim 1 wherein said first and said second current sources are based on MOS type transistors.

3. The negative capacitance circuit according to claim 1 wherein said first and said second diodes are emitter-collector junctions of bipolar transistors.

4. A negative capacitance circuit, comprising:
a first input terminal and a second input terminal;
a first branch having a first bias resistor, a first diode, a first transistor having a first terminal coupled to said first diode and having second and third terminals, and a first current source coupled to said second terminal of said first transistor;
a second branch having a second bias resistor, a second diode, a second transistor having a first terminal coupled to said second diode and having second and third terminals, and a second current source coupled to said second terminal of said second transistors wherein said third terminal of said first transistor is coupled to said first terminal of said second transistor and to said second input terminal, and wherein said third terminal of said second transistor is coupled to said first terminal of said first transistor and to said first input terminal;
a capacitor coupled between said second terminal of said first transistor and said second terminal of said second transistor; and
a linearization resistor coupled between said second terminal of said first transistor and said second terminal of said second transistor.

5. The circuit of claim 4 wherein said first and second transistors are bipolar junction transistors, and wherein said first terminals are collector terminals, said second terminals are emitter terminals, and said third terminals are base terminals.

6. The circuit of claim 4 wherein said first and second current sources are MOS type transistors.

7. The circuit of claim 4 wherein said first and second current sources are bipolar junction transistors.

8. A mobile telecommunication device, comprising:
a filter including:
an acoustic resonator having first and second resonant frequencies;
a circuit coupled to said acoustic resonator, said circuit having a negative capacitance that is adjustable to shift at least said first resonant frequency of said resonator, said circuit including:
first and second input terminals;
a first branch having a first resistor, a first diode, a first transistor, and a first current source;
a second branch having a second resistor, a second diode, a second transistor, and a second current source, wherein said first transistor is coupled to said second transistor and to said second input terminal, and wherein said second transistor is coupled to said first transistor and to said first input terminal;
a capacitor coupled between said first transistor and said second transistor; and
a third resistor coupled between said first transistor and said second transistor.

9. The device of claim 8 wherein:
said first transistor has a first terminal coupled to said first diode, a second terminal coupled to said first current source, and a third terminal coupled to said second transistor and to said second input terminal, and
said second transistor has a first terminal coupled to said second diode, a second terminal coupled to said second current source, and a third terminal coupled to said first transistor.

10. The device of claim 8 wherein said negative capacitance of said circuit is adjustable to shift said first resonant frequency of said resonator while keeping said second resonant frequency of said resonator unchanged.

11. The device of claim 8 wherein said filter further includes an adjustable capacitor coupled to said resonator.

12. The device of claim 11 wherein said negative capacitance of said circuit is adjustable to shift said first and second resonant frequencies of said resonator in a same direction, or in opposite directions.

13. The device of claim 11, further comprising a loss compensation circuit coupled to said filter, said loss compensation circuit having a third transistor, a third current source, and a fourth resistor to achieve a voltage controlled oscillator that is adapted to be adjusted by adjustment of said negative capacitance.

14. The device of claim 8 wherein said acoustic resonator is a bulk acoustic wave (BAW) type acoustic resonator.

15. The device of claim 8 wherein said acoustic resonator is a surface acoustic wave (SAW) type acoustic resonator.

16. A method to tune a filter that includes an acoustic resonator having first and second capacitances, the method comprising:
adjusting a negative capacitance of a circuit coupled to said acoustic resonator to shift a first resonant frequency of said acoustic resonator upward, if an absolute value of said negative capacitance is lower than a sum of said first and second capacitances;
adjusting said negative capacitance of said circuit coupled to said acoustic resonator to shift said first resonant frequency of said acoustic resonator downward, if said absolute value of said negative capacitance is higher than said sum of said first and second capacitances.

17. The method of claim 16 wherein said adjusting said negative capacitance to shift said first resonant frequency includes shifting said first resonant frequency while keeping said second resonant frequency unchanged.

18. The method of claim 16 wherein said filter includes a capacitor coupled to said acoustic resonator and having a third capacitance, the method further comprising:
adjusting said negative capacitance of said circuit coupled to said acoustic resonator to shift said first resonant frequency of said acoustic resonator downward and to shift said second resonant frequency upward, if said absolute value of said, negative capacitance is between a range defined by: (a) said sum of said first and second capacitances, and (b) a sum of said first, second, and third capacitances,
wherein said adjusting said negative capacitance to shift said first resonant frequency upward, if said absolute value of said negative capacitance is lower than said sum of said first and second capacitances, includes shifting both said first and second resonant frequencies upward, and wherein said adjusting said negative capacitance to shift said first resonant frequency of said acoustic resonator downward, if said absolute value of said negative capacitance is higher than said sum of said first and second capacitances, includes shifting both said first and second resonant frequencies downward if said absolute value is higher than said sum of said first, second, and third capacitances.

19. A filter, comprising:
an acoustic resonator having an anti-resonance frequency;
a circuit coupled to said acoustic resonator, said circuit having a negative capacitance that is adjustable to shift said anti-resonance frequency of said resonator, said circuit including:
   first and second input terminals;
   a first branch having a first resistor, a first diode, a first transistor, and a first current source;
   a second branch having a second resistor, a second diode, a second transistor, and a second current source, wherein said first transistor is coupled to said second transistor and to said second input terminal, and wherein said second transistor is coupled to said first transistor and to said first input terminal;
   a capacitor coupled between said first transistor and said second transistor; and
   a third resistor coupled between said first transistor and said second transistor.

20. The filter of claim 19 wherein said filter further includes an adjustable capacitor coupled to said resonator.

21. The filter of claim 19, further comprising a loss compensation circuit coupled to said circuit, said loss compensation circuit including:
   a third transistor having first and second conduction terminals and a control terminal, the first conduction terminal being coupled to a first supply terminal;
   a third current source coupled between the second conduction terminal of the third transistor and a second supply terminal; and
   a fourth resistor coupled between the second conduction terminal of the third transistor and the control terminal of the third transistor.

22. The filter of claim 19 wherein said acoustic resonator is a bulk acoustic wave acoustic resonator.

23. A voltage control oscillator, comprising:
an acoustic resonator having first and second resonant frequencies;
a circuit coupled to said acoustic resonator, said circuit having a negative capacitance that is adjustable to shift at least said first resonant frequency of said resonator, said circuit including:
   first and second input terminals;
   a first branch having a first resistor, a first diode, a first transistor, and a first current source;
   a second branch having a second resistor, a second diode, a second transistor, and a second current source, wherein said first transistor is coupled to said second transistor and to said second input terminal, and wherein said second transistor is coupled to said first transistor and to said first input terminal;
   a capacitor coupled between said first transistor and said second transistor; and
   a third resistor coupled between said first transistor and said second transistor.

24. The voltage control oscillator of claim 23 wherein said voltage control oscillator filter further includes an adjustable capacitor coupled to said resonator.

25. The voltage control oscillator of claim 23, further comprising a loss compensation circuit coupled to said circuit, said loss compensation circuit including:
   a third transistor having first and second conduction terminals and a control terminal, the first conduction terminal being coupled to a first supply terminal;
   a third current source coupled between the second conduction terminal of the third transistor and a second supply terminal; and
   a fourth resistor coupled between the second conduction terminal of the third transistor and the control terminal of the third transistor.

26. The voltage control oscillator of claim 23 wherein said acoustic resonator is a bulk acoustic wave acoustic resonator.

* * * * *